United States Patent
Albou

(10) Patent No.: US 10,386,031 B2
(45) Date of Patent: Aug. 20, 2019

(54) LIGHT DEVICE WITH MOVABLE SCANNING MEANS AND OPTICAL FIBER

(71) Applicant: VALEO VISION, Bobigny (FR)

(72) Inventor: Pierre Albou, Bobigny (FR)

(73) Assignee: VALEO VISION, Bobigny (FR)

(*) Notice: Subject to any disclaimer, the term of this patent is extended or adjusted under 35 U.S.C. 154(b) by 0 days.

(21) Appl. No.: 15/922,220

(22) Filed: Mar. 15, 2018

(65) Prior Publication Data

US 2018/0266641 A1 Sep. 20, 2018

(30) Foreign Application Priority Data

Mar. 15, 2017 (FR) ...................................... 17 52123

(51) Int. Cl.
| | |
|---|---|
| F21S 41/16 | (2018.01) |
| F21S 41/63 | (2018.01) |
| F21S 41/20 | (2018.01) |
| H01S 5/00 | (2006.01) |
| F21S 41/64 | (2018.01) |
| F21V 14/04 | (2006.01) |

(52) U.S. Cl.
CPC ............ *F21S 41/16* (2018.01); *F21S 41/285* (2018.01); *F21S 41/635* (2018.01); *F21S 41/645* (2018.01); *H01S 5/005* (2013.01); *F21V 14/04* (2013.01)

(58) Field of Classification Search
None
See application file for complete search history.

(56) References Cited

U.S. PATENT DOCUMENTS

| | | | |
|---|---|---|---|
| 2007/0187580 A1* | 8/2007 | Kykta ................. | G02B 27/017 250/227.15 |
| 2007/0263678 A1* | 11/2007 | Mizuuchi ........... | G02B 27/0006 372/22 |
| 2013/0135593 A1* | 5/2013 | Saitou ................. | G03B 21/204 353/31 |
| 2013/0258689 A1 | 10/2013 | Takahira et al. | |
| 2013/0278903 A1* | 10/2013 | Lippey ................. | G02B 27/48 353/31 |
| 2014/0232987 A1* | 8/2014 | Westphal .............. | A61B 3/12 351/206 |
| 2014/0375959 A1* | 12/2014 | Yang .................... | G03B 21/204 353/31 |

(Continued)

OTHER PUBLICATIONS

French Preliminary Search Report dated Feb. 2, 2018 in French Application 17 52123 filed on Mar. 15, 2017 (with English Translation of Categories of Cited Documents).

*Primary Examiner* — Elmito Breval
(74) *Attorney, Agent, or Firm* — Oblon, McClelland, Maier & Neustadt, L.L.P.

(57) ABSTRACT

A light device, notably for a motor vehicle including at least one laser light source emitting a laser light beam, a wavelength conversion material capable of converting one part of a laser light beam, diffusing another part of the laser light beam and combining the diffused and converted parts into a resultant primary light beam, a movable scanning means for scanning the laser light beam onto the wavelength conversion material, an optical means of projection of the primary light beam, an optical fiber arranged for receiving on an input face the laser light beam emitted by the laser light source and for directing the laser light beam toward the movable scanning means.

17 Claims, 3 Drawing Sheets

(56) References Cited

U.S. PATENT DOCUMENTS

| | | |
|---|---|---|
| 2016/0018075 A1 | 1/2016 | Ohno |
| 2016/0109074 A1* | 4/2016 | Hirasawa .................. F21K 9/64 362/511 |
| 2016/0131334 A1* | 5/2016 | Rousseau ............. G02B 6/0006 362/19 |
| 2016/0215947 A1* | 7/2016 | Matsuno ................. F21S 41/24 |
| 2016/0223892 A1* | 8/2016 | Takahashi ............ H04N 9/3111 |
| 2016/0348856 A1* | 12/2016 | Owada ...................... F21V 9/16 |

* cited by examiner

LIGHT DEVICE WITH MOVABLE SCANNING MEANS AND OPTICAL FIBER

The present invention relates to the field of light devices for a motor vehicle. More particularly, the invention relates to a light device for a motor vehicle.

A motor vehicle generally includes a plurality of light devices constituting means of lighting or signaling or lighting the interior of the passenger compartment fulfilling various functions. These functions are notably fulfilled thanks to the emission of a light beam, the properties of which vary from one function to another.

When the light beam has to have a strong light intensity, it is known to use a high luminance light source, e.g. a laser. Then it is desirable, both to modify the light spectrum of this beam by wavelength conversion means known per se, and to focus this beam so as to form a light spot of predetermined shape on a target formed by said conversion means. In this context, the device may incorporate a movable scanning means formed by one or more micro-mirrors intended to scan a light beam passing through said movable scanning means and forming a light patch on the wavelength conversion means, in order to create an outgoing light beam from the light after projection by a means of projection having the desired shape. However, these various means are subject to spatial requirement constraints, notably at the front of the motor vehicle. Indeed, the front part of a motor vehicle includes numerous elements, the spatial requirement of which needs to be limited as much as possible.

In such a movable scanning means, the shape and the size of the spot on the wavelength conversion material depend on the geometry of the system. More particularly, they depend on the dimensions of the movable scanning means and its distance with respect to the wavelength conversion material and the light source. For the purpose of obtaining a rectangular spot on the wavelength conversion material, an anamorphic optic may be used. Then it is preferable to direct the light source and the associated optic for directing the rectangular spot onto the wavelength conversion material.

For obtaining improved performance in automotive lighting, more particularly for performing highway lighting functions without increasing the number of modules, some solutions of the prior art recommend using a plurality of light sources by movable scanning means. Various methods are conceivable for this, notably the use of a polarizing separator, also known as a "polarizing beam splitter" (PBS). Polarizing separators are used for splitting the unpolarized beam into two polarized parts. In this case, and except for the optional use of an expensive half-wave plate, the two superimposed spots finally created in the plane of the conversion material are directed at 90 degrees forming a spot in the shape of a plus sign, also known as a "Swiss flag" shape. A half-wave plate designates an optical tool capable of modifying the polarization of the light beam passing through it.

It is possible that the light beam has cutouts and in order to improve the quality of the cutouts of the light beam, the spot may take a preferred direction when it is elongated: a spot in the shape of a plus sign is not very advantageous from this point of view.

Furthermore, any change of movable scanning means or of light source involves a redesign of the focusing optic and the mechanical mounting, notably in the case of a change of light source. Finally, the device obtained is quite bulky since it includes a plurality of light sources, a plurality of focusing optics, couplers and a plurality of movable scanning means, behind or around the projection lens.

The present invention will improve the situation.

A first aspect of the invention relates to a light device, notably for a motor vehicle including:
- at least one laser light source emitting a laser light beam;
- a wavelength conversion material capable of converting one part of a laser light beam, diffusing another part of the laser light beam and combining the diffused and converted parts into a resultant primary light beam;
- a movable scanning means for scanning the laser light beam onto the wavelength conversion material;
- an optical means of projection of the primary light beam;
- an optical fiber arranged for receiving on an input face the laser light beam emitted by the laser light source and for directing said laser light beam toward the scanning means.

Thus, the use of an optical fiber makes it possible to uncouple the constraints that apply on the one hand to the source, and on the other hand, to the part of the device including the movable scanning means and the conversion means. It is thus easier to respect predefined geometrical constraints, such as the geometrical constraints mentioned in the introductory part.

In addition, the wavelength conversion material may be a plate of photoluminescent material.

The photoluminescent material may notably be chosen according to the wavelength of the laser light source so as to increase the efficiency of the conversion and reduce the light losses.

According to one embodiment, the laser light source may be a laser diode including an emission face perpendicular to an optical emission axis.

According to one embodiment, the optical fiber may be a multimode optical fiber.

Thus, the laser light beam may enter the fiber along a plurality of possible input angles. Furthermore, such a multimode fiber is advantageous in the case of short paths.

According to one embodiment, the optical fiber may be defined by at least one core diameter and one numerical aperture, and, the core diameter, the numerical aperture and the arrangement of the optical fiber relative to the scanning means are such that the scanned beam forms a patch of at most 300 micrometers on the conversion means.

Thus, the resolution of the scanning of the laser light beam on the wavelength conversion material is only slightly affected by the introduction of the optical fiber.

In addition, the core diameter, the numerical aperture and the arrangement of the optical fiber relative to the movable scanning means may be such that the scanned beam forms a patch of at most 250 micrometers on the conversion means.

Thus, the resolution of the scanning of the laser light beam on the wavelength conversion material is not affected by the introduction of the optical fiber.

According to one embodiment, the light device may include a means of focusing or a means of anamorphosis arranged between the output of the optical fiber and the movable scanning means.

Thus, it is possible to obtain different magnifications of the source of the incident beam according to directions of modification of divergence of the means of anamorphosis or of the means of focusing.

According to one embodiment, the light device may include a primary means of anamorphosis arranged between each light source and the input face of the optical fiber.

Thus, it is possible to control the size of the image formed from the light source at the level of the input face of the optical fiber and the numerical aperture of the incident beam.

In addition, the primary means of anamorphosis may be arranged so as to form an image of the emitted light beam, on the optical fiber, said image having dimensions less than or equal to the input face of the optical fiber and the numerical aperture of the incident beam being less than or equal to that of the optical fiber.

Thus, the loss of power at the level of the input face of the optical fiber is limited or avoided.

In addition, the primary means of anamorphosis may include at least two lenses.

In addition, each lens may be arranged so as to modify the divergence of an incident beam along a given processing direction for obtaining a predetermined magnification along the given processing direction.

Thus, the primary means of anamorphosis comprising two lenses makes it possible to control the magnification obtained along a given processing direction for the incident beam at the level of the input face of the optical fiber, thus making it possible to optimize the size of the image formed on the input face of the optical fiber.

In addition, the processing directions of the lenses of the means of anamorphosis are perpendicular to each other.

In addition, the magnifications of the lenses of the primary means of anamorphosis may be distinct.

Thus, it is possible to obtain images of the incident light beam of different sizes at the level of the input face of the optical fiber.

Alternatively, the lenses of the primary means of anamorphosis may be cylindrical lenses having respective generators extending in planes perpendicular to each other.

According to one embodiment, the light device may include a primary light source emitting a first light beam and a secondary light source emitting a second light beam, and the optical fiber may be arranged for receiving on the input face the first and second laser light beams so as to direct said first and second laser light beams toward the scanning means.

Thus, the use of two laser light sources makes it possible to increase the power of the incident laser light beam.

Alternatively, the primary and secondary light sources may be arranged so as to emit polarized laser light beams in respective planes perpendicular to each other. The maximum and minimum divergences of the beam from a laser diode are located in two perpendicular planes that are parallel to the sides of the output facet. By taking into account these two planes, with the aid of cylindrical lenses, the axes thereof are then parallel to one or other of these planes and perpendicular to the emission axis.

In addition, the light device may comprise a means of combining capable of combining the laser beams from the primary and secondary light sources.

Thus, it is possible to obtain a single laser light beam at the output of the means of combining and in the direction of the input face of the optical fiber.

In addition, the means of combining may include a polarizer located between the primary and secondary light sources and the input face of the optical fiber.

Thus it is possible to obtain a single laser light beam at the output of the polarizer.

Other features and advantages of the invention will appear on examining the detailed description below, and the appended drawings in which.

Because of their power, laser diodes may require heat dissipation means or control means. However, the presence of the various elements of a light device reduces the available space for incorporating all these elements. The light device therefore exhibits a plurality of constraints:

it is preferable that the size of the laser light beam scanned on the photoluminescent material does not exceed a limit value, at the risk of affecting the resolution of the projected image;

the distance between the movable scanning means and the wavelength conversion material is sufficient to prevent the movable scanning means from obstructing the output of the wavelength conversion material, e.g. 36 mm;

the width of the beam at the output of the means of anamorphosis must not exceed that of the movable scanning means at the risk of causing a loss of flux or a possible destruction of the functional parts of the movable scanning means. However, as stated previously, the laser diode also has constraints, notably regarding the angle of divergence of the light beam and the size of the emission surface.

As detailed in what follows, and according to the invention, the use of an optical fiber, notably a multimode optical fiber, as an intermediate element has the function of offering a standardized output on the side of the movable scanning means. The multimode optical fiber is entirely characterized by the size of its core and its numerical aperture.

The numerical aperture of the fiber is understood to mean a cone of acceptance of the fiber: if a light ray attempts to penetrate the fiber from this cone, then the ray is guided by total internal reflection; otherwise, the ray is not guided.

According to the invention, the optical fiber also has the function of making it possible to distance the laser sources from the movable scanning means and the objective. The use of an optical fiber may optionally allow the coupling of a plurality of laser sources.

Patch or "spot" here designates the image formed of the core of the optical fiber at the surface of a wavelength conversion material, as will be better understood by referring to FIG. 4 described below. Since the dimensions of the spot are imposed by the applications, the magnification of the system is therefore imposed for an optical fiber of a given core diameter. It may also be considered that, conversely, the core diameter of the optical fiber is imposed for an optical system of a given magnification. Furthermore, if for a given movable scanning means, it is imposed that all of the light coming from the optical fiber meets the movable scanning means and that the distance thereof with respect to the conversion material is imposed, it is deduced that a mathematical relationship between the diameter of the fiber and its numerical aperture is imposed.

Figure 1A:
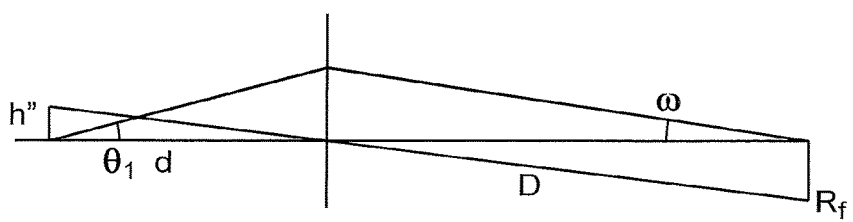
FIG. 1A illustrates an optical path of a light ray in a light device.
Figure 1B:
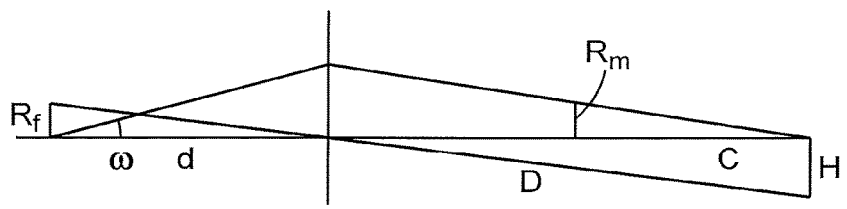
FIG. 1B illustrates an optical path of a light ray in a light device, and notably the distance between the mobile scanning means and the wavelength conversion material.

The coupling of the source in the optical fiber with the use of a conventional means, such as a simple convergent, biconvex or non-biconvex, ball-shaped lens, etc., imposes a relationship between the divergences of the laser light beam imposed by the source, the dimensions of said source, the dimensions of the scanning device, the size wanted for the final spot and the distance of the scanning means to the conversion means. FIGS. 1A and 1B illustrate a paraxial approximation, i.e. with angles of low values such as, for example, an angle of 15°, using an extreme ray coming from the center of the source and reconciling all the constraints of the system by using the distance from the movable scanning means to the conversion material as an adjustment variable. FIG. 1A recalls a basic calculation in geometrical optics. An object is designated here of height h", the larger dimension of the source, which in practice corresponds to the long side of the output facet of the laser diode, the image of which through the convergent lens has a height $R_f$, the radius of the optical fiber core.

The extreme ray coming from the center of the object has an incidence of angle $\theta_1$, this angle corresponding to the numerical aperture of the beam of the laser diode. In practice the angle corresponds to the half-angle of divergence in the far field along the fast axis. This same outgoing ray from the lens forms an angle co with the horizontal axis of the lens, an angle corresponding to the numerical aperture of the fiber. A geometrical calculation makes it possible to obtain the following relationship:

$$\frac{D}{d} = \frac{R_f}{h''} = \frac{\tan(\theta_1)}{\tan(\omega)}$$

In FIG. 1B, the quantity c represents the distance between:
the object of height $R_m$, the movable scanning means, e.g. a "Micro-Opto-Electro-Mechanical System" (MO-EMS) type means of diameter $2R_m$, and
the image of the object of height Rf (the core at the output of the fiber) of height H (the radius of the targeted spot, e.g. 250 µm).

Applying the formula for magnification and trigonometric relationships provides the following mathematical relationships:

$$\frac{R_m}{C} = \frac{d\tan(\omega)}{D} = \frac{R_f}{H}\tan(\omega) = \frac{R_f}{H}\tan(\theta_1)\frac{h''}{R_f} = \frac{h''}{H}\tan(\theta_1)$$

$$C = \frac{R_m H}{h''\tan(\theta_1)}$$

The features of the fiber, chosen by the person skilled in the art according to the constraints of the system, are eliminated from the formulae.

In practice, it is uncommon for the distance value obtained in this way to be mechanically acceptable. The numerical application for a simple injection with a single convergent lens in the case of a blue laser diode available on the market for which h"=14 µm and $\theta_1$=23°, a common MOEMS of diameter 1 mm and a spot of 250 µm in diameter, provides the result c=10.5 mm, which is too small for implementing the device according to the invention.

In order to meet the specifications of the system i.e. the choice of the source, the size of the spot and the MOEMS and also to be able to control its geometry with, for example, the choice of the distance C without sacrificing optical efficiency, it is preferable to use a more complex light injection optic. Indeed, the creation of the spot by a beam passing through the scanning device at a given distance from the conversion means imposes, as has previously been established, the following mathematical relationship for the optical fiber:

$$R_f \cdot \tan(\omega) = \frac{H R_m}{C}$$

It is generally possible to obtain fibers approximately meeting the above relationship. However, these fibers as a general rule are not suited to the injection of the light from the laser diode with the aid of a single convergent lens, at least without deliberate loss of a part of the beam. On the other hand, it is possible to achieve it by proceeding as follows: in the plane containing the slow axis of the laser diode and the optical axis, a magnification $g_1$ of the long side of the emission surface of the light source is provided in order to match it, after magnification, to the diameter of the core of the fiber.

In the plane containing the fast axis of the laser diode and the optical axis, this plane being perpendicular to the preceding plane, a reduction in the numerical aperture of the beam is provided, which is very divergent in this plane, in order to match it to that of the optical fiber.

The resulting magnification $g_2$, in the aforementioned plane, is far greater than in the preceding plane.

However, the short side of the emission surface of the source is magnified here. The short side of the emission surface of the source is proportionally, with respect to the long side of the emission surface of the source, smaller than the magnification ratio $g_1/g_2$. The image of the source on the input of the optical fiber is then entirely contained in the disk corresponding to the core of the fiber. The image of the source on the input of the optical fiber is then a rectangle of different aspect ratio from that of the emitting surface of the source. Accordingly, it is possible to designate the optic described here as creating an anamorphosis.

Just as in the plane containing the slow axis of the source, the reduction in numerical aperture of the beam is less than in the plane containing the fast axis, but the aperture of the beam from the source is proportionally much smaller along the fast axis than along the slow axis, so that the beam also remains in this plane and finally totally inside the cone of acceptance of the fiber.

For producing such an optic, a minimum of two diopters should be used exhibiting optical powers in perpendicular planes.

Each diopter exhibits little or no power in the plane where the other diopter exhibits its main power. In front of each of the diopters, in order to obtain different magnifications of the same object, such as the source, for example, in the same image plane, such as the input face of the fiber, these two diopters are located away from the source by different distances.

The nearest diopter to the source provides the greatest magnification. The closest diopter to the source therefore possesses power in the plane containing the fast axis and the optical axis. In practice, for avoiding the use of a thick lens, it is preferable to use two distinct lenses.

Figure 2:
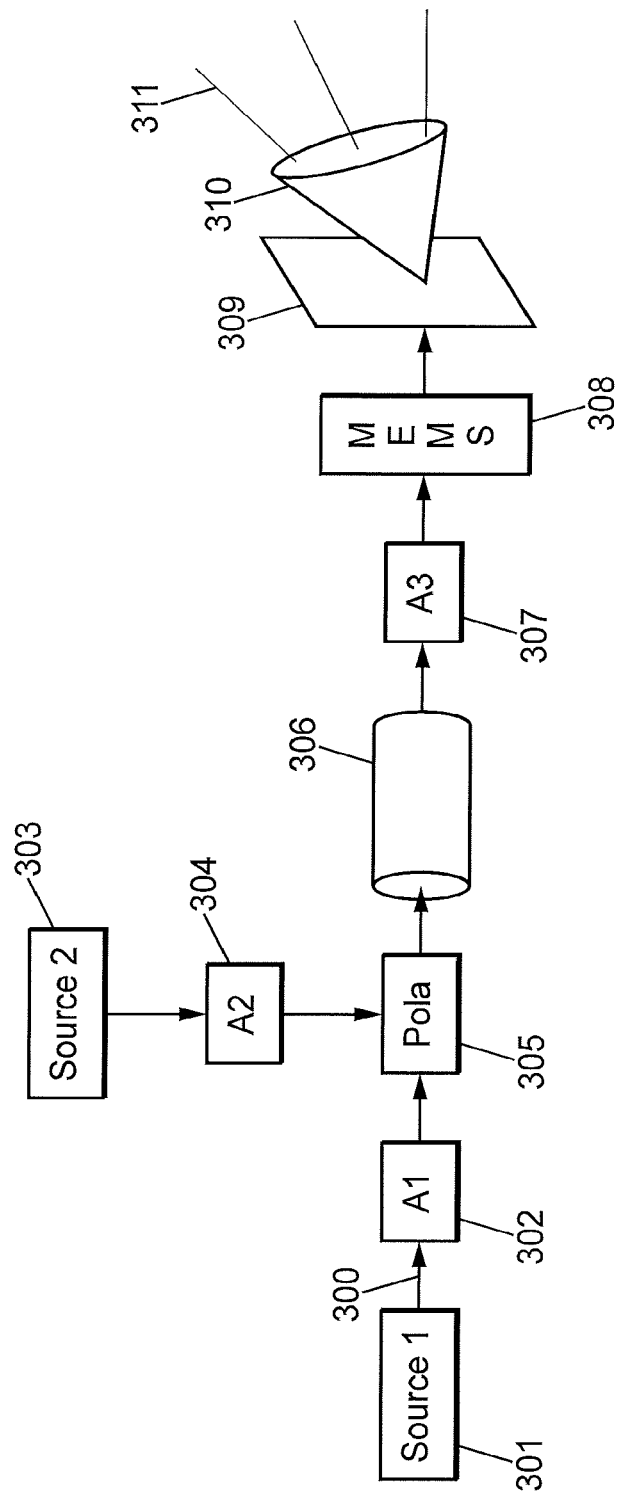
FIG. 2, depicts a light device according to an embodiment of the invention.

FIG. 2, depicts a light device according to an embodiment of the invention. The device includes at least one laser light source 301 emitting a laser light beam 300. The device also includes an optical fiber 306 arranged for receiving on an input face the laser light beam 300 emitted by the laser light source 301 so as to direct said laser light beam toward a movable scanning means 308.

The electronically controlled movable scanning means 308 known as "MEMS", for "microelectromechanical systems", scans the laser light beam received in the direction of a wavelength conversion material 309 capable of converting one part of a laser light beam, diffusing another part of the laser light beam and combining the diffused and converted parts into a resultant light beam. The wavelength conversion material 309 reflects the light beam toward an optical means of projection 310 of the resultant light beam, which projects this resultant light beam 311 into the highway scene in front of the motor vehicle.

The use of an optical fiber makes it possible to focus the laser light beam onto the wavelength conversion material by passing through a given movable scanning means located at a given distance from said wavelength conversion material. The introduction of the optical fiber into the light device makes it possible to meet the geometrical constraints of the light device.

FIG. 3 more particularly describes, in an illustrative manner, a light device further including a secondary laser light source 303. The use of a secondary laser light source and a primary laser light source makes it possible to increase the power.

The device also includes two primary means of anamorphoses 302 and 304 located respectively straight after the primary and secondary laser light sources. The primary means of anamorphosis comprise at least two lenses. Each lens is arranged for modifying the divergence of the incident laser light beam 300 along a given processing direction. The aim is to obtain a predetermined magnification of the source of the incident laser light beam 300 along the given processing direction.

The processing directions of the lenses of each means of anamorphosis are perpendicular to each other and the magnifications of the lenses of each primary means of anamorphosis are distinct from each other. The lenses included in each means of anamorphosis are accordingly cylindrical lenses generating distinct profiles extending in planes perpendicular to each other.

The light device may include a means of recombining comprising a polarizer 305 arranged between the first and second laser light sources 301 and 303 and the input face of the optical fiber 306, notably arranged between the primary means of anamorphosis 302 and 304 and the input face of the optical fiber 306.

The light device may comprise a means of anamorphosis 307 arranged between the output of the optical fiber 306 and the movable scanning means 308. The means of anamorphosis 307 is arranged for modifying the divergences of the laser light beam at the output of the optical fiber 306 along two directions perpendicular to each other so as to obtain different magnifications along these two directions. The use of the optical fiber 306 makes it possible to advantageously use simple focusing with a single convergent lens at the output of the optical fiber 306.

The movable scanning means 308 and the optical projection device 310 are located on each side of the conversion material 309. The conversion material 309 may also, preferentially, be deposited on a reflective substrate. A resultant laser light beam 311 intended to be projected onto the highway comes from the projection device 310.

The laser light beams coming from the laser sources 301 and 303 respectively pass through the means of anamorphosis 302 and 304. The laser light sources 301 and 303 are arranged for emitting polarized laser type light beams in two planes perpendicular to each other.

In FIG. 3, the laser light sources are, for example, arranged so that their emission faces extend in planes perpendicular to each other and are turned 90° with respect to one another. If the means of anamorphoses 302 and 304 are identical, they are preferentially arranged in such a way as to be turned by 90° with respect to one another, except in the case of the use of a half-wave plate. The laser light beams coming from the means of anamorphosis 302 and 304 pass through a means of beam recombining including a polarizer 305. The resultant laser light beam coming from the polarizer 305 is then directed toward the input face of the optical fiber 306.

At the output of the optical fiber 306, the light beam passes through another means of anamorphosis 307 located before the movable scanning means 308. The movable scanning means 308 comprising a plurality of movable micro-mirrors receives the laser light beam from the output face of the optical fiber 306 and the means of anamorphosis 307 and distributes it spatially over the surface of the wavelength conversion material 309. Accordingly, the illumination of the surface of the wavelength conversion material 309 is obtained by scanning the laser light beam coming from the assembly including the optical fiber 306 and the means of anamorphosis 307.

The surface of the wavelength conversion material 309 may include phosphors which may be deposited on a reflective substrate for the laser light beam. The surface of the conversion material 309 may consist of a continuous and homogeneous layer of phosphors. The outgoing laser light beam is then directed toward a projection device 310 that produces a resultant laser light beam 311 for a lighting fulfilling a given light function.

Figure 3A:
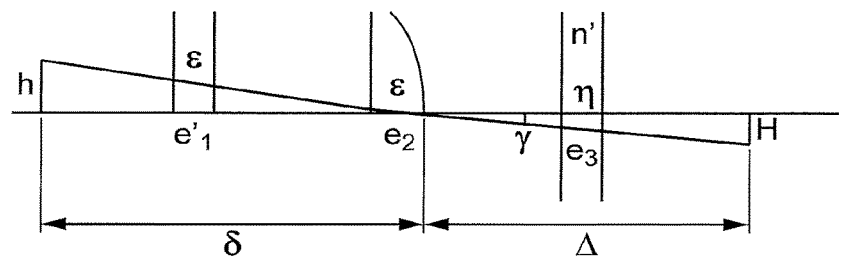
FIGS. 3A, 3B and 3C illustrate the positioning of the cylindrical lenses of the primary means of anamorphoses in a light device according to an embodiment of the invention.
Figure 3B:
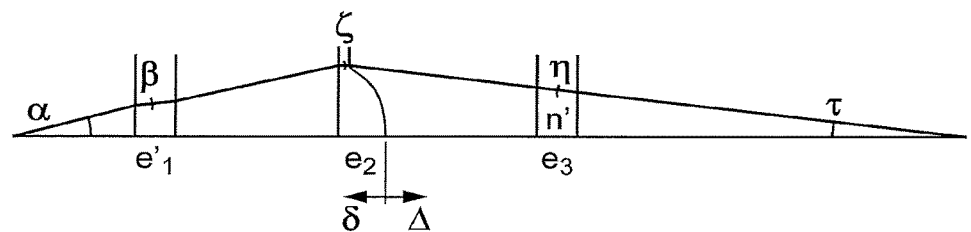

FIGS. 3A and 3B illustrate a geometrical calculation of the positions of the cylindrical lenses of the primary means of anamorphoses according to the material thicknesses of the various elements of the device: protective plate of the source, lenses and polarizing beam splitter.

In FIG. 3A, in the plane of the slow axis, h represents the height of an object and H the height of the image of this object through the second cylindrical lens. The quantities $e_1'$, $e_2$ and $e_3$ represent the respective thicknesses of the protective plate of the laser light source plus the thickness at the center of the first lens, the cylindrical lens and the polarizing beam splitter. The protective plate of the source and the lenses are, for example, made of materials of the same refractive index n. The refractive index n' corresponds to the refractive index of the material of the polarizing beam splitter.

The distances $\delta$ and $\Delta$ respectively represent the distance between the object and the cylindrical lens and the distance between the cylindrical lens and the image of the object. The angles $\varepsilon$, $\gamma$ and $\eta$ correspond to the angle with the optical axis of the laser light ray respectively considered in the protective plate of the source and the lenses, in air and in PBS. The ray considered in this calculation passes through the intersection of the output face of the second lens and the optical axis.

Geometrical calculation provides the following equalities:

$H(\Delta - e_3)\tan(\gamma) + e_3 \tan(\eta)$ $h = (\delta - e_1' - e_2)\tan(\gamma) + (e_1 + e_2)\tan(\varepsilon)$ By assuming $$g = \frac{H}{h}$$

and considering that the angle $\gamma$ tends toward 0 for obtaining the paraxial value of the magnification, g then tends from the laws of geometrical optics toward $$\frac{(\Delta - e_3) + \frac{e_3}{n'}}{\delta - (e_1' + e_2) + \frac{e_1' + e_2}{n}}$$

The following equality is thereby deduced:

$$\Delta = g\left(\delta - (e'_1 + e_2)\frac{n-1}{n} + e_3\frac{n'-1}{n'}\right)$$

by considering the paraxial value of g, otherwise known. Indeed, the value of g is equal to the ratio of the diameter of the core of the optical fiber to the length of the long side of the lighting surface of the laser source.

$\delta$ and $\Delta$ are deduced for a given total spatial requirement $\delta+\Delta$ of the source at the input of the optical fiber.

In FIG. 3B, in the same plane as that of FIG. 3A, a ray is propagated, coming from the center of the source inclined by an angle $\alpha$ with respect to the optical axis. The quantity $\zeta$ represents the distance in projection on the optical axis traveled by the ray in the second lens. The angle r represents the angle between the light ray coming from the polarizing beam splitter and the horizontal.

Geometrical calculation and the laws of geometrical optics provide the following equalities:

$$(\delta - e'_1 - e_2)\tan(\alpha) + (e'_1 + \zeta)\tan(\beta) = (\Delta - e_3 + (e_2 - \zeta))\tan(r) + e_3\tan(\eta)$$

$$\frac{\delta - e'_1 - e_2}{\cos(\alpha)} + n\frac{e'_1 + \zeta}{\cos(\beta)} + \frac{\Delta - e_3 + e_2 - \zeta}{\cos(r)} + n'\frac{e_3}{\cos(\eta)} =$$

$$\delta + \Delta - e'_1 - e_2 - e_3 + n(e'_1 + e_2) + n'e_3$$

according to Fermat's theorem,
and according to Descartes' laws:
n·sin($\beta$)=sin($\alpha$); n' sin($\eta$)=sin($\tau$)

It is possible to eliminate the quantities $\beta$, $\eta$ and $\alpha$ among the above equations, so as to obtain an equation in $\zeta$, a function of $\tau$. The numerical solution function $\zeta(\tau)$ of this equation then makes it possible to construct the cross-section of the second cylindrical lens, which is thus entirely defined from the geometrical and physical design quantities of the device.

Figure 3C:
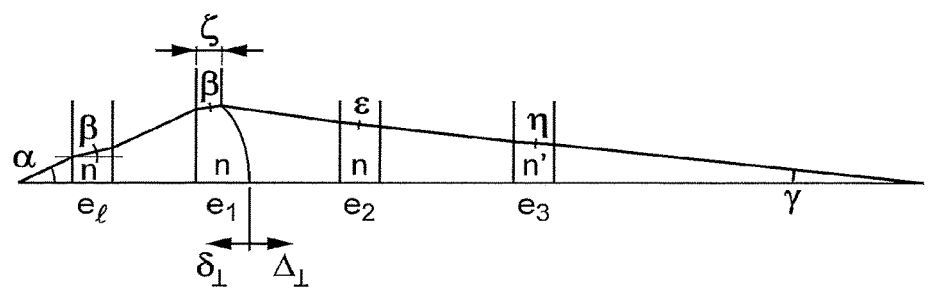

FIG. 3C corresponds to the plane of the fast axis and the optical axis, this plane is perpendicular to the plane of FIGS. 3A and 3B. The lens is acylindrical of thickness $e_1$. The protective plate of the laser light source has a thickness $e_{1\perp}$. The incident beam of angle $\alpha$ has an angle $\beta$ inside the protective plate of the laser light source. The quantity $\zeta$ represents the distance in projection on the optical axis traveled by the ray in the second lens. The second lens of thickness $e_2$ deflects the beam by an angle $\varepsilon$. The angle $\gamma$ represents the angle between the light ray coming from the polarizing beam splitter and the horizontal.

Geometrical calculation and the laws of geometrical optics provide the following equalities:

$$\delta + \Delta = \delta_\perp + \Delta_\perp$$

$$(\delta_\perp - e_1 - e_l)\tan(\alpha) + (e_l + \zeta)\tan(\beta) =$$

$$(\Delta_\perp - e_2 - e_3 + (e_1 - \zeta))\tan(\gamma) + e_2\tan(\varepsilon) + e_3\tan(\eta)$$

$$\frac{(\delta_\perp - e_1 - e_l)}{\cos(\alpha)} + n\frac{e_l}{\cos(\beta)} + n\frac{\zeta}{\cos(\beta)} + \frac{\Delta_\perp - e_2 - e_3 + e_1 - \zeta}{\cos(\gamma)} + n\frac{e_2}{\cos(\varepsilon)} +$$

$$n'\frac{e_3}{\cos(\eta)} = \delta_\perp - e_1 - e_l + n(e_1 + e_l) + \Delta_\perp - e_2 - e_3 + ne_2 + n'e_3 =$$

$$\delta + \Delta + (n-1)(e_l + e_1 + e_2) + (n'-1)l$$

according to Fermat's theorem,
and according to Descartes' laws:
n·sin($\beta$)=sin($\alpha$); n' sin($\eta$)=sin($\gamma$); n·sin($\varepsilon$)=sin($\gamma$)

By eliminating $\beta$, $\eta$, $\varepsilon$, $\zeta$ and $\Delta_\perp$ from the above equations, an equation in $\gamma$ a function of $\alpha$ and of $\delta_\perp$ is obtained. It is imposed that, for $\alpha$, the half-top angle of the source beam in the plane of the fast axis, $\gamma=\omega$ with $\omega$ the half-top angle corresponding to the numerical aperture of the optical fiber. This may be expressed by the fact that the whole beam enters the optical fiber. Thereby $\delta_\perp$ and accordingly $\Delta_\perp$ are deduced.

By repeating the above six equations and eliminating $\alpha$, $\beta$, $\eta$, $\varepsilon$ an equation in $\zeta$, a function of $\gamma$ is obtained. The numerical solution function $\zeta(\gamma)$ of this equation then makes it possible to construct the cross-section of the first cylindrical lens, which is thus entirely defined from the geometrical and physical design quantities.

Accordingly, having obtained the geometrical deviation values $\delta_\perp$ and $\Delta_\perp$ as above, it is also provided by the invention, that instead of calculating these values analytically, to model the cross-sections of the cylindrical lenses by polynomial functions of sufficiently high degree e.g. of degree 8 and have the parameters calculated therefrom by optimization software.

While lenses calculated as previously described actually allow a good injection of light from the sources in the optical fiber, it should be noted that the rays widely deviated from the calculation planes, notably the rays coming from sources with values close to the extreme divergence values, both in the fast axis plane and in the slow axis plane, do not exactly follow the planned paths, the system has notable aberrations in the corners of the field. This problem may be corrected if this proves necessary, in the case of the loss of a significant number of rays, either by modifying one of the plane faces of the cylindrical lenses into a biconical or polynomial surface with cross terms, e.g. of the form $X^kY^i$, or by pushing the sources of the calculation infinitely backward by placing the real sources at the focuses of collimation lenses. Each anamorphoser then includes three lenses: a collimation lens and two cylindrical lenses; this more expensive solution may nevertheless be justified in the case of small series production in order to avoid the investment in the complex mold of the cylindrical lens with a modified input face.

Thus, the use of an optical fiber makes it possible to uncouple the constraints that apply on the one hand to the source, and on the other hand, to the part of the device including the movable scanning means and the conversion means. It is thus easier to meet predefined geometrical constraints, such as the optical constraints involved in the above calculations.

Of course, the invention is not limited to the embodiments previously described and provided solely by way of example. It encompasses various modifications, alternative forms and other variants that may be envisaged by the person skilled in the art within the framework of the present invention and notably any combinations of the various embodiments previously described.

The invention claimed is:

1. A lighting device for a motor vehicle, the lighting device comprising:
   at least one laser light source emitting a laser light beam;
   an optical fiber arranged to receive on an input face thereof the laser light beam emitted by the laser light source and direct the laser light beam toward a movable scanner;
   the movable scanner arranged to scan the laser light beam directed by the optical fiber;

a wavelength conversion material arranged to receive the scanned laser light beam, convert one part of the scanned laser light beam, diffuse another part of the scanned laser light beam and combine the diffused and converted parts into a resultant primary light beam;

an optical projector to project the primary light beam; and a primary anamorphosis optical element arranged between the at least one light source and the input face of the optical fiber, wherein the primary anamorphosis optical element includes at least two lenses, and each lens is arranged to modify divergence of an incident beam along a given processing direction for obtaining a predetermined magnification along the given processing direction.

2. The lighting device according to claim 1, wherein the optical fiber comprises at least one core diameter and one numerical aperture, and wherein, the core diameter, the numerical aperture and the arrangement of the optical fiber relative to the movable scanner are such that the scanned beam forms an image of at most 300 micrometers on the conversion material.

3. The lighting device according to claim 2, further comprising a primary light source emitting a first light beam and a secondary light source emitting a second light beam, wherein the optical fiber is arranged to receive on the input face the first and second laser light beams so as to direct said first and second laser light beams toward the movable scanner.

4. The lighting device according to claim 2, wherein the core diameter, the numerical aperture and the arrangement of the optical fiber relative to the movable scanner are such that the scanned beam forms an image of at most 250 micrometers on the conversion material.

5. The lighting device according to claim 1, further comprising a focusing optical element or an anamorphosis optical element arranged between the output of the optical fiber and the movable scanner.

6. The lighting device according to claim 5, wherein the processing directions of the lenses of the anamorphosis optical element are perpendicular to each other.

7. The lighting device according to claim 6, wherein magnifications of the lenses of the primary anamorphosis optical element are distinct.

8. The lighting device according to claim 7, wherein the lenses of the primary anamorphosis optical element are cylindrical lenses having respective generators extending in planes perpendicular to each other.

9. The lighting device according to claim 1, wherein the primary anamorphosis optical element is arranged so as to form an image of the emitted light beam, on the optical fiber, the image having dimensions less than or equal to the input face of the optical fiber and the numerical aperture of the incident beam being less than or equal to that of the optical fiber.

10. The lighting device according to claim 1, further comprising a primary light source emitting a first light beam and a secondary light source emitting a second light beam, wherein the optical fiber is arranged to receive on the input face thereof the first and second laser light beams to direct the first and second laser light beams toward the movable scanner.

11. The lighting device according to claim 10, wherein the primary and secondary light sources are arranged so as to emit polarized laser light beams in respective planes perpendicular to each other.

12. The lighting device according to claim 10, further comprising a combining optical element to combine and polarize the laser beams from the primary and secondary light sources.

13. The lighting device according to claim 12, wherein the combining optical element includes a polarizer located between the primary and secondary light sources and the input face of the optical fiber.

14. The lighting device according to claim 10, further comprising a focusing optical element or an anamorphosis optical element arranged between the output of the optical fiber and the movable scanner.

15. The lighting device according to claim 10, further comprising a primary anamorphosis optical element arranged between each light source and the input face of the optical fiber.

16. The lighting device according to claim 15, wherein the primary anamorphosis optical element includes at least two lenses.

17. The lighting device according to claim 16, wherein the lenses of the primary anamorphosis optical element are cylindrical lenses having respective generators extending in planes perpendicular to each other.

* * * * *